(12) United States Patent
Hu et al.

(10) Patent No.: US 11,302,863 B2
(45) Date of Patent: Apr. 12, 2022

(54) STT MRAM MATERTAILS WITH HEAVY METAL INSERTION

(71) Applicant: International Business Machines Corporation, Armonk, NY (US)

(72) Inventors: Guohan Hu, Yorktown Heights, NY (US); Daniel Worledge, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 148 days.

(21) Appl. No.: 16/791,459

(22) Filed: Feb. 14, 2020

(65) Prior Publication Data

US 2021/0257540 A1 Aug. 19, 2021

(51) Int. Cl.
*H01L 43/02* (2006.01)
*H01L 27/22* (2006.01)

(52) U.S. Cl.
CPC ............ *H01L 43/02* (2013.01); *H01L 27/222* (2013.01)

(58) Field of Classification Search
CPC .............................. H01L 43/02; H01L 27/222
See application file for complete search history.

(56) References Cited

U.S. PATENT DOCUMENTS

| | | |
|---|---|---|
| 9,425,387 B1 | 8/2016 | Liu et al. |
| 9,460,397 B2 | 10/2016 | Apalkov et al. |
| 2008/0007991 A1* | 1/2008 | Diteweg ............... G11C 11/16 365/158 |
| 2013/0119495 A1* | 5/2013 | Vetr ...................... G11C 11/161 257/E29.323 |
| 2014/0264671 A1 | 9/2014 | Chepulskyy et al. |
| 2015/0091110 A1 | 4/2015 | Kuo et al. |
| 2018/0190899 A1* | 7/2018 | Kim ..................... G11C 11/161 |

OTHER PUBLICATIONS

Couet, S., et al., "Impact of Ta and W-based spacers in double MgO STT-MRAM free layers on perpendicular anisotropy and damping", Applied Physics Letters, published online Oct. 11, 2017, p. 152406-1 to 152406-4, 111.

Endoh, T., et al., "A Recent Progress of Spintronics Devices for Integrated Circuit Applications", Journal of Low Power Electronics and Applications, Published: Nov. 13, 2018, 17 pages, 8, 44.

Liu, E., et al., "Synthetic-Ferromagnet Pinning Layers Enabling Top-Pinned Magnetic Tunnel Junctions for High-Density Embedded Magnetic Random-Access Memory", Physical Review Applied, published Nov. 26, 2018, p. 054054-1 to 054054-11, 10.

(Continued)

*Primary Examiner* — Marc Anthony Armand
(74) *Attorney, Agent, or Firm* — Scully, Scott, Murphy & Presser, P.C.; Daniel P. Morris, Esq.

(57) ABSTRACT

A bottom pinned magnetic tunnel junction (MTJ) stack having improved switching performance is provided which can be used as a component/element of a spin-transfer torque magnetoresistive random access memory (STT MRAM) device. The improved switching performance which, in turn, can reduce write errors and improve write voltage distributions, is obtained by inserting at least one heavy metal-containing layer into the magnetic free layer and/or by forming a heavy metal-containing layer on a MTJ capping layer that is located above the magnetic free layer.

20 Claims, 2 Drawing Sheets

(56) References Cited

OTHER PUBLICATIONS

Sato, N., et al., "Two-terminal spin-orbit torque magnetoresistive random access memory", Nat. Electron, Published Sep. 13, 2018, pp. 508-511, 1.
U.S. Appl. No. 15/999,229, entitled: Multilayered magnetic free layer structure for spin-transfer torque (STT) MRAM, filed on Aug. 16, 2018, 28 pages, First Named Inventor: Guohan Hu.

* cited by examiner

STT MRAM MATERIALS WITH HEAVY METAL INSERTION

BACKGROUND

The present application relates to magnetoresistive random access memory (MRAM). More particularly, the present application relates to a bottom pinned magnetic tunnel junction (MTJ) stack having improved switching performance which can be used as a component/element of a spin-transfer torque (STT) MRAM device.

STT MRAM devices use a 2-terminal device which includes a MTJ stack that contains a magnetic pinned (reference) layer, a tunnel barrier layer and a magnetic free layer. FIG. 1 illustrates a prior art bottom pinned MTJ stack that includes a magnetic pinned (or reference) layer 10, a tunnel barrier layer 12, and a magnetic free layer 14; the arrow within the magnetic pinned layer 10 shows a possible orientation of that layer and the double headed arrow in the magnetic free layer 14 illustrates that the orientation in that layer can be switched. The magnetization of the magnetic pinned layer 10 is fixed in one direction (say pointing up as shown in FIG. 1) and a current passed through the junction makes the magnetic free layer 14 anti-parallel to the magnetic pinned layer 10. A smaller current (of either polarity) is used to read the resistance of the device, which depends on the relative orientations of the magnetic pinned layer 10 and the magnetic free layer 14.

STT MRAM has the advantages of lower power consumption and better scalability over conventional magnetoresistive random access memory which uses magnetic fields to flip the active elements. In STT MRAM, spin-transfer torque is used to flip (switch) the orientation of the magnetic free layer. Moreover, spin-transfer torque technology has the potential to make possible STT MRAM devices combining low current requirements and reduced cost; however, the amount of current needed to reorient (i.e., switch) the magnetization is at present too high for most commercial applications.

SUMMARY

A bottom pinned MTJ stack having improved switching performance is provided which can be used as a component/element of a STT MRAM device. The improved switching performance which, in turn, can reduce write errors and improve write voltage distributions, is obtained by inserting at least one heavy metal-containing layer into the magnetic free layer and/or by forming a heavy metal-containing layer on a MTJ capping layer that is located above the magnetic free layer. The term "heavy metal-containing layer" is used throughout the present application to denote a discrete layer that contains a metal or a combination of metals (i.e., a metal alloy) having an atomic number of equal to, or greater than, 42. The heavy metal-containing layer is in itself non-magnetic.

In one aspect of the present application, a bottom pinned MTJ stack having improved switching performance is provided. In one embodiment of the present application, the bottom pinned MTJ structure includes a tunnel barrier layer located on a magnetic pinned layer, and a magnetic free layer located on the tunnel barrier layer. In accordance with this embodiment, the magnetic free layer has at least one heavy metal-containing layer inserted (i.e., embedded) therein.

In some embodiments, the bottom pinned MTJ stack that contains the magnetic free layer having the at least one heavy metal-containing layer inserted therein further includes a MTJ capping layer and another heavy metal-containing layer located above the magnetic free layer.

In another embodiment of the present application, the bottom pinned MTJ structure includes a tunnel barrier layer located on a magnetic pinned layer, a magnetic free layer located on the tunnel barrier layer, a MTJ capping layer located on the magnetic free layer, and a heavy metal-containing layer located on the MTJ capping layer.

In another aspect of the present application, a STT MRAM device is provided that includes a bottom pinned MTJ stack located on a bottom electrode. In one embodiment of the present application, the bottom pinned MTJ structure that is present on the bottom electrode includes a tunnel barrier layer located on a magnetic pinned layer, and a magnetic free layer located on the tunnel barrier layer. In accordance with this embodiment, the magnetic free layer has at least one heavy metal-containing layer inserted therein.

In some embodiments, the bottom pinned MTJ stack that contains the magnetic free layer having the at least one heavy metal-containing layer inserted therein further includes a MTJ capping layer and another heavy metal-containing layer located above the magnetic free layer.

In another embodiment, the bottom pinned MTJ structure that is present on the bottom electrode includes a tunnel barrier layer located on a magnetic pinned layer, a magnetic free layer located on the tunnel barrier layer, a MTJ capping layer located on the magnetic free layer, and a heavy metal-containing layer located on the MTJ capping layer.

DETAILED DESCRIPTION

Figure 1:
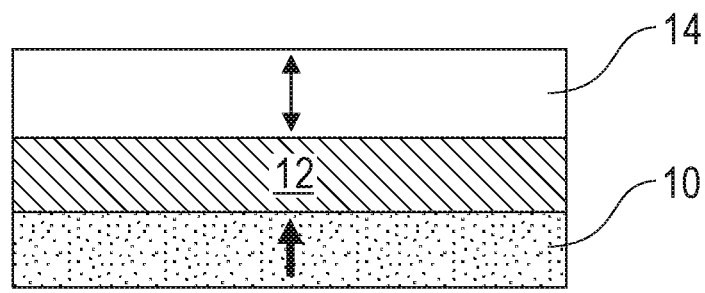
FIG. 1 is a cross sectional view of a prior art bottom pinned MTJ stack including, from bottom to top, a magnetic pinned (or reference) layer, a tunnel barrier layer, and a magnetic free layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 2:
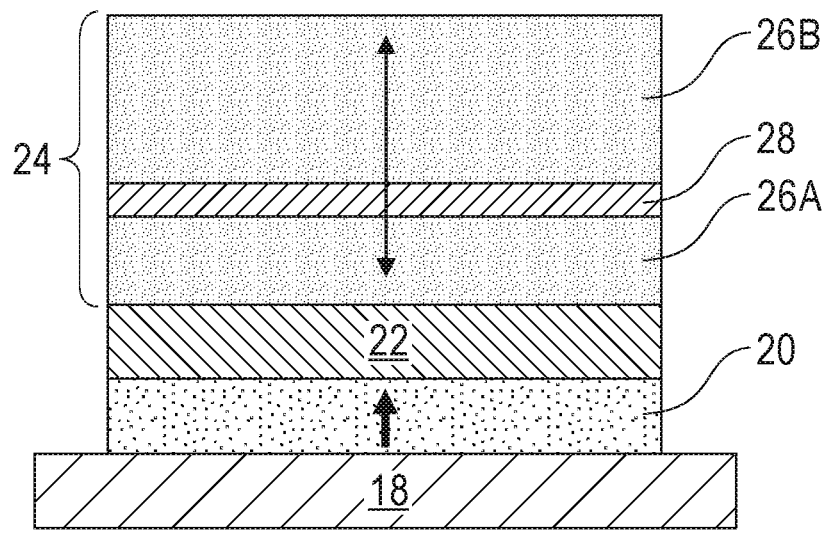
FIG. 2 is a cross sectional view of a bottom pinned MTJ stack in accordance with an embodiment of the present application and located on a bottom electrode, wherein the bottom pinned MTJ stack includes, from bottom to top, a magnetic pinned (or reference) layer, a tunnel barrier layer, and a magnetic free layer having at least one heavy metal-containing layer inserted therein.
Figure 3:
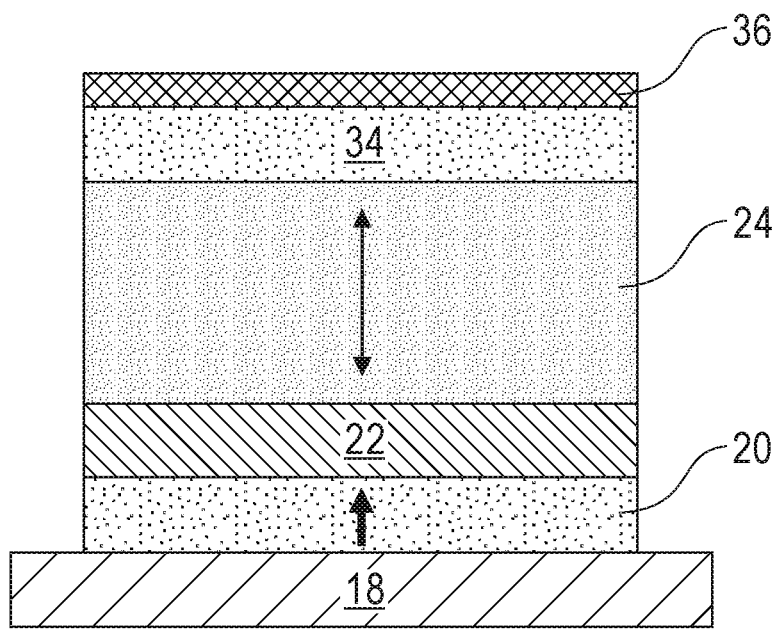
FIG. 3 is a cross sectional view of a bottom pinned MTJ stack in accordance with another embodiment of the present application and located on a bottom electrode, wherein the bottom pinned MTJ stack includes, from bottom to top, a magnetic pinned (or reference) layer, a tunnel barrier layer, a magnetic free layer, a MTJ capping layer, and a heavy metal-containing layer.
Figure 4:
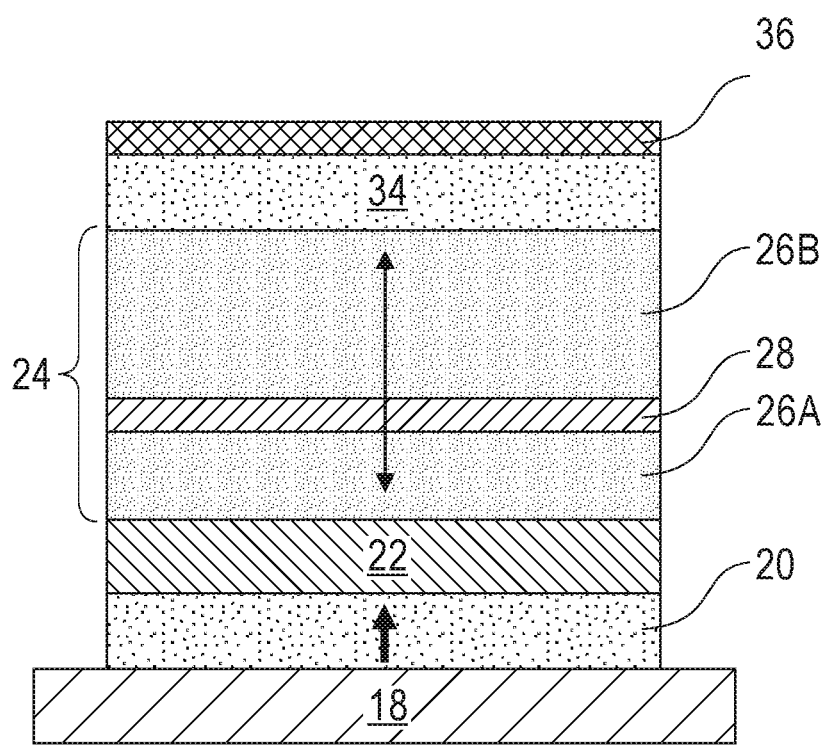
FIG. 4 is a cross sectional view of a bottom pinned MTJ stack in accordance with yet another embodiment of the present application and located on a bottom electrode, wherein the bottom pinned MTJ stack includes, from bottom to top, a magnetic pinned (or reference) layer, a tunnel barrier layer, a magnetic free layer having at least one heavy metal-containing layer inserted therein, a MTJ capping layer, and another heavy element-containing layer.

The present application provides bottom pinned MTJ stacks such as, is shown in FIGS. 2, 3 and 4, that have improved switching performance. The bottom pinned MTJ stacks of the present application can be used as a component/element of a STT MRAM device. The improved switching performance which, in turn, can reduce write errors and improve write voltage distributions, is obtained by inserting at least one heavy metal-containing layer into the magnetic free layer and/or by forming a heavy metal-containing layer on a MTJ capping layer that is located above the magnetic free layer.

U.S. patent application Ser. No. 15/999,229, entitled "MULTILAYERED MAGNETIC FREE LAYER STRUCTURE FOR SPIN-TRANSFER TORQUE (STT) MRAM, filed on Aug. 16, 2018 describes a bottom pinned MTJ stack that includes, from bottom to top, a magnetic pinned layer, a tunnel barrier layer, and a multilayered magnetic free layer structure comprising a first magnetic free layer having a first magnetic damping value and a second magnetic free layer having a second magnetic damping value separated by a non-magnetic layer, wherein the second magnetic damping value is greater than the first magnetic damping value and is 0.01 or greater. The higher damping that is disclosed in U.S. patent application Ser. No. 15/999,229 can be provided by a heavy metal that is inserted into, or on, the second magnetic free material. The heavy metal used in U.S. patent application Ser. No. 15/999,229 can be in the form of a discrete metal layer embedded in the second magnetic free layer, or the heavy metal used in U.S. patent application Ser. No. 15/999,229 can be in the form of a dopant or alloying element that is incorporated in the second magnetic free layer, or the heavy metal may be a cap that is located at a top of the second magnetic free layer.

The bottom pinned MTJ stacks described herein differ from the bottom pinned MTJ stacks disclosed in U.S. patent application Ser. No. 15/999,229. Notably, the bottom pinned MTJ stacks described herein lack the multilayered magnetic free layer structure (i.e., the first magnetic free layer having the first magnetic damping value and the second magnetic free layer having the second magnetic damping value separated by the non-magnetic layer) disclosed in U.S. patent application Ser. No. 15/999,229. In U.S. patent application Ser. No. 15/999,229, the first and the second magnetic free layers are weakly exchange coupled together. During the switching process, the spin torque generated by the current destabilizes the first magnetic free layer, but does not act on the second magnetic free layer. The second magnetic free layer is switched by the magnetic exchange field through the non-magnetic layer, separating the first and second magnetic free layers. In this application, the magnetic free layer with heavy metal insertion still switches as a whole, instead of two separate layers.

Referring now to FIG. 2, there is illustrated a bottom pinned MTJ stack in accordance with an embodiment of the present application. As is shown in FIG. 2, the bottom pinned MTJ stack is located on a bottom electrode 18. In this embodiment of the present application, the bottom pinned MTJ stack includes, from bottom to top, a magnetic pinned (or reference) layer 20, a tunnel barrier layer 22, and a magnetic free layer 24 having at least one heavy metal-containing layer 28 inserted therein. In FIG. 2, a single heavy metal-containing layer 28 is shown to be present in the magnetic free layer 24 such that the single heavy metal-containing layer 28 is located between a first magnetic region 26A and a second magnetic region 26B. Although a single heavy metal-containing layer 28 is shown to be present in the magnetic free layer 24 of the structure shown in FIG. 2, the present application is not limited to such an embodiment. Instead, a plurality of heavy metal-containing layers can be inserted into the magnetic free layer 24 so as to separate various magnetic regions of the magnetic free layer 24. In the present application, the first magnetic region 26A and the second magnetic region 26B are coupled together magnetically so that in equilibrium and during magnetic switching the first and second magnetic regions have magnetizations that are parallel to each other.

Referring now to FIG. 3, there is illustrated a bottom pinned MTJ stack in accordance with another embodiment of the present application. As is shown in FIG. 3, the bottom pinned MTJ stack is located on a bottom electrode 18. In this embodiment of the present application, the bottom pinned MTJ stack includes, from bottom to top, a magnetic pinned (or reference) layer 20, a tunnel barrier layer 22, a magnetic free layer 24 (without any heavy metal-containing layer inserted therein), a MTJ capping layer 34, and a heavy metal-containing layer 36.

Referring now to FIG. 4, there is illustrated a bottom pinned MTJ stack in accordance with yet another embodiment of the present application. As is shown in FIG. 4, the bottom pinned MTJ stack is located on a bottom electrode 18. In this embodiment of the present application, the bottom pinned MTJ stack includes, from bottom to top, a magnetic pinned (or reference) layer 20, a tunnel barrier layer 22, a magnetic free layer 24 having at least one heavy metal-containing layer 28 inserted therein, a MTJ capping layer 34, and another heavy element-containing layer 36. In FIG. 4, a single heavy metal-containing layer 28 is shown to be present in the magnetic free layer 24 such that the single heavy metal-containing layer 28 is located between a first magnetic region 26A and a second magnetic region 26B. Although a single heavy metal-containing layer 28 is shown to be present in the magnetic free layer 24 of the structure shown in FIG. 4, the present application is not limited to such an embodiment. Instead, a plurality of heavy metal-containing layers can be inserted into the magnetic free layer 24 so as to separate various magnetic regions of the magnetic free layer 24. In the present application, the first magnetic region 26A and the second magnetic region 26B are coupled together magnetically so that in equilibrium and during switching the first and second magnetic regions have magnetizations that are parallel to each other.

The various elements of the structures shown in FIGS. 2, 3 and 4 will now be described in greater detail. Collectively, the bottom electrode 18 and the bottom pinned MTJ stacks illustrated in FIGS. 2, 3 and 4 provide elements/components of a STT MRAM device. The bottom electrode 18 that is present beneath each of the bottom pinned MTJ stacks of the present application is typically located on a surface of an electrically conductive structure (not shown). The electrically conductive structure is embedded in an interconnect dielectric material layer (also not shown). Another interconnect dielectric material layer (not shown) may embed the bottom pinned MTJ stacks of the present application. Another electrically conductive structure and a top electrode (both of which are not shown) can be located above the topmost surface of the bottom pinned MTJ stacks of the present application.

The bottom electrode 18 can be composed of an electrically conductive material such as, for example, an electrically conductive metal, an electrically conductive metal alloy, or an electrically conductive metal nitride. Examples of electrically conductive metals that can be used to provide the bottom electrode 18 include, but are not limited to, copper (Cu), ruthenium (Ru), cobalt (Co), rhodium (Rh), tungsten (W), aluminum (Al), tantalum (Ta) or titanium (Ti). An example of electrically conductive metal alloy that can be used to provide the bottom electrode 18 includes, but is not limited to, Cu—Al, and an example of electrically conductive metal nitride that can be used to provide the bottom electrode 18 includes, but is not limited to, TaN or TiN. The bottom electrode 18 can be formed utilizing techniques well known to those skilled in the art. The conductive material that provides the bottom electrode 18 can be formed utilizing a deposition process such as, for example, chemical vapor deposition (CVD), plasma enhanced chemical vapor deposition (PECVD), sputtering or plating. The bottom electrode 18 can have a thickness from 10 nm to 200 nm; although other thicknesses are possible and can be used as the thickness of the bottom electrode 18. The bottom electrode 18 can be formed on a recessed surface or a non-recessed surface of the electrically conductive structure (not shown).

The magnetic pinned layer 20 that is employed in the present application has a fixed magnetization; the magnetic pinned layer 20 can also be referred to as a magnetic reference layer. The magnetic pinned layer 20 can be composed of a metal or metal alloy that includes one or more metals exhibiting high spin polarization. In alternative embodiments, exemplary metals for the formation of the magnetic pinned layer 20 include iron, nickel, cobalt, chromium, boron, and manganese. Exemplary metal alloys may include the metals exemplified above (i.e., iron, nickel, cobalt, chromium, boron, and manganese). In another embodiment, the magnetic pinned layer 20 may be a multilayer arrangement having (1) a high spin polarization region formed from of a metal and/or metal alloy using the metals mentioned above (i.e., iron, nickel, cobalt, chromium, boron, and manganese), and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. The magnetic pinned layer 20 that can be employed in the present application can have a thickness from 3 nm to 20 nm; although other thicknesses for the magnetic pinned layer 20 can be used.

The tunnel barrier layer 22 is composed of an insulator material and is formed at such a thickness as to provide an appropriate tunneling resistance. Exemplary materials for the tunnel barrier layer 22 include magnesium oxide, aluminum oxide, and titanium oxide, or materials of higher electrical tunnel conductance, such as semiconductors or low-bandgap insulators. In one embodiment, magnesium oxide is used as the material that provides the tunnel barrier layer 22. The thickness of tunnel barrier layer 22 can be from 0.5 nm to 1.5 nm; although other thicknesses for the tunnel barrier layer 22 can be used as long as the selected thickness provides a desired tunnel barrier resistance. The tunnel barrier layer 22 forms a first interface with the magnetic pinned layer 20 and a second interface, opposite the first interface, with the magnetic free layer 24.

The magnetic free layer 24 is composed of at least one magnetic material with a magnetization that can be changed in orientation relative to the magnetization orientation of the magnetic pinned (i.e., reference) layer. Exemplary magnetic materials for the magnetic free layer 24 include alloys and/or multilayers of cobalt (Co), iron (Fe), alloys of cobalt-iron (Co—Fe), nickel (Ni), alloys of nickel-iron (Ni—Fe), and alloys of cobalt-iron-boron (Co—Fe—B). The magnetic free layer 24 that can be employed in the present application can have a thickness from 1 nm to 3 nm; although other thicknesses for the magnetic free layer 24 can be used.

In some embodiments of the present application, and as is illustrated in FIGS. 2 and 4, at least one heavy metal-containing layer 28 is inserted into the magnetic free layer 24. The least one heavy metal-containing layer 28 can be referred to herein as a heavy metal-containing insertion layer. In the present application, the at least one heavy metal-containing layer 28 that is inserted into the magnetic free layer 24 is embedded in the magnetic free layer 24 such that magnetic regions (e.g. first magnetic region 26A and second magnetic region 26B) are located above and beneath the at least one heavy metal-containing layer 28. In some embodiments, and as is shown in FIG. 3, no heavy metal-containing layer is inserted into the magnetic free layer 24. In either embodiment, the magnetic free layer 24 is not a composite magnetic free layer structure composed of two magnetic layers which are weakly coupled together and can switch separately under current, as disclosed in U.S. patent application Ser. No. 15/999,229.

When present, the least one heavy metal-containing layer 28 is a discrete heavy metal-containing layer that is composed of a metal or a combination of metals (i.e., a metal alloy) having an atomic number of equal to, or greater than, 42. In some embodiments, the metal or combination of metals used in providing least one heavy metal-containing layer 28 has an atomic number of equal to, or greater than, 74. Heavier metals within the heavy metal range mentioned above provide greater improvement in switching performance. The metal or combination of metals that provides the least one heavy metal-containing layer 28 can include a noble metal, a refractory metal, a rare earth metal or alloys thereof. Examples of metals that can be employed in the present application as the least one heavy metal-containing layer 28 include, but are not limited to, Ru, Rh, Pd, Hf, W, Re, Os, Jr, Pt, La, Sm, Gd, Tb, Ce, Pr, Nd, Eu, Dy, Ho, Yb or Er. Each heavy metal-containing layer 28 has a thickness from 0.05 nm to 1 nm. In some embodiments, each heavy metal-containing layer 28 embedded in the magnetic free layer 24 can be compositionally the same as each other. In other embodiments, at least one of the heavy metal-containing layers embedded in the magnetic free layer 24 can be compositionally different from at least one other heavy metal-containing layer embedded in the magnetic free layer 24. Each heavy metal-containing layer 28 embedded in the magnetic free layer must be thin enough so that the magnetic regions, i.e., the first magnetic region 26A and the second magnetic region 26B, of the magnetic free layer 24 are strongly magnetically coupled together and switch as a whole under current.

In some embodiments and as is shown in FIGS. 3 and 4, a MTJ capping layer 34 is present on the magnetic free layer 24; the MTJ capping layer 34 can also be present on the magnetic free layer shown in FIG. 2. The MTJ capping layer 34 is preferentially composed of magnesium oxide (MgO). Other materials for the MTJ capping layer 34 include aluminum oxide ($Al_2O_3$), calcium oxide (CaO), tantalum oxide ($Ta_2O_5$), niobium oxide ($Nb_2O_5$) or ternary oxides such as, for example, $Mg_yTi_{(1-y)}O_x$. In the present application, and when the heavy metal-containing layer 36 is formed on the MTJ capping layer 34, the MTJ capping layer 34 must be thin enough so as not to deter the affects of the heavy metal-containing layer 36 has on the magnetic free layer 24. Typically, the MTJ capping layer 34 has a thickness from 0.3 nm to 2 nm.

In some embodiments and as is shown in FIGS. 3 and 4, a heavy metal-containing layer 36 is located on the MTJ capping layer 34; the heavy metal-containing layer 36 can be referred herein as a heavy metal-containing cap layer. The heavy metal-containing layer 36 is a discrete heavy metal-containing layer that is composed of a metal or combination of metals (i.e., metal alloy) having an atomic number of equal to, or greater than, 42. In some embodiments, the metal or combination of metals used in providing the heavy metal-containing layer 36 has an atomic number of equal to, or greater than, 74. Heavier metals within the heavy metal range mentioned above provide greater improvement in switching performance. The metal or combination of metals that provides the heavy metal-containing layer 36 can include a noble metal, a refractory metal, a rare earth metal or alloys thereof. Examples of metals that can be employed in the present application as the heavy metal-containing layer 36 include, but are not limited to, Ru, Rh, Pd, Hf, W, Re, Os, Ir, Pt, La, Sm, Gd, Tb, Ce, Pr, Nd, Eu, Dy, Ho, Yb or Er. In some embodiments of the present application, the heavy metal-containing layer 36 is compositionally the same as the at least one heavy metal-containing layer 28 inserted into the magnetic free layer 24. In other embodiments, the heavy metal-containing layer 36 is compositionally different from the at least one heavy metal-containing layer 28 inserted into the magnetic free layer 24. The heavy metal-containing layer 36 that is located on the MTJ capping layer 34 can have a thickness from 0.1 nm to 5 nm.

In some embodiments, an etch stop layer (not shown) and a hard mask (also not shown) can be formed atop the bottom pinned MTJ stacks illustrated in FIGS. 2, 3 and 4. The etch stop layer can be optional. When present, the etch stop layer is composed of a metal such as, for example, ruthenium (Ru) or iridium (Jr) that has a higher etch rate compared to the hard mask which prevents the magnetic pinned layer 20, the tunnel barrier layer 22 and the magnetic free layer 24 from being exposed to the etchant materials used to pattern the hard mask. The etch stop layer can have a thickness from 5.0 nm to 30 nm; although other thicknesses for the etch stop layer can be used in the present application.

The hard mask can be composed of a metal nitride such as, for example, tantalum nitride (TaN) or titanium nitride (TiN) or a metal such as, for example, titanium (Ti) or tantalum (Ta), which is compositionally different from the material used to provide the etch stop layer. In some embodiments, the hard mask can be employed as a top electrode of the STT MRAM device. In other embodiment, a separate top electrode (composed of one of the electrically conductive materials mentioned above for the bottom electrode 18) can be formed on the hard mask. The hard mask can have a thickness from 50 nm to 1500 nm; although other thicknesses for the hard mask can be used in the present application.

The bottom pinned MTJ stacks shown in FIGS. 2, 3, 4 can be formed by deposition of the various material layers that provide the specific bottom pinned MTJ stack followed by a patterning process such as, for example, lithography and etching. The bottom pinned MTJ stacks of the present application can have a critical dimension (CD) that is less than, or equal to, the critical dimension (CD) of the bottom electrode 18. The deposition of the various material layers that provide the specific bottom pinned MTJ stack can be performed in a same deposition tool or different deposition tools. For example, the magnetic pinned layer 20, the tunnel barrier layer 22, the magnetic free layer 24, and the at least one heavy metal-containing layer 28 can be deposited in a first deposition tool, and the MTJ capping layer 34, the heavy metal-containing layer 36, the optional etch stop layer, and the hard mask can be deposited in a second deposition tool, which differs from the first deposition tool, and has deposition rates suitable for the deposition of those individual layers.

The various materials that provide the bottom pinned MTJ stacks of the present application can be deposited by chemical vapor deposition (CVD), plasma enhanced chemical vapor deposition (PECVD), physical vapor deposition (PVD), atomic layer deposition (ALD) or sputtering. The various materials that provide the bottom pinned MTJ stacks of the present application can be deposited utilizing the same or different deposition process.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A bottom pinned magnetic tunnel junction (MTJ) stack comprising:
   a tunnel barrier layer located on a magnetic pinned layer; and
   a magnetic free layer located on the tunnel barrier layer, wherein the magnetic free layer comprises a heavy metal-containing layer sandwiched between a first magnetic region of the magnetic free layer and a second magnetic region of the magnetic free layer.

2. The bottom pinned MTJ stack of claim 1, wherein the heavy metal-containing layer is composed of a noble metal, a refractory metal, a rare earth metal or alloys thereof.

3. The bottom pinned MTJ stack of claim 1, wherein the heavy metal-containing layer has a thickness from 0.05 nm to 1 nm.

4. The bottom pinned MTJ stack of claim 1, wherein the magnetic free layer has a magnetization that can be changed in orientation relative to a magnetization orientation of the magnetic pinned layer.

5. The bottom pinned MTJ stack of claim 1, further comprising a MTJ capping layer located on the magnetic free layer, and another heavy metal-containing layer located on the MTJ capping layer.

6. The bottom pinned MTJ stack of claim 5, wherein the another heavy metal-containing layer located on the MTJ capping layer is compositionally the same as the heavy metal-containing layer present in the magnetic free layer.

7. The bottom pinned MTJ stack of claim 5, wherein the another heavy metal-containing layer located on the MTJ capping layer is compositionally different from the heavy metal-containing layer present in the magnetic free layer.

8. The bottom pinned MTJ stack of claim 5, wherein the another heavy metal-containing layer located on the MTJ capping layer has a thickness from 0.1 nm to 5 nm.

9. The bottom pinned MTJ stack of claim 5, wherein the another heavy metal-containing layer located on the MTJ capping layer is composed of a noble metal, a refractory metal, a rare earth metal or alloys thereof.

10. A bottom pinned magnetic tunnel junction (MTJ) stack comprising:
a tunnel barrier layer located on a magnetic pinned layer;
a magnetic free layer located on the tunnel barrier layer;
a MTJ capping layer located on the magnetic free layer; and
a heavy metal-containing layer located on the MTJ capping layer, wherein the heavy metal-containing layer is spaced apart from the magnetic free layer by at least the MTJ capping layer.

11. The bottom pinned MTJ stack of claim 10, wherein the heavy metal-containing layer is composed of a noble metal, a refractory metal, a rare earth metal or alloys thereof.

12. The bottom pinned MTJ stack of claim 10, wherein the heavy metal-containing layer has a thickness from 0.1 nm to 5 nm.

13. The bottom pinned MTJ stack of claim 10, wherein the magnetic free layer has a magnetization that can be changed in orientation relative to a magnetization orientation of the magnetic pinned layer.

14. A spin-transfer torque magnetoresistive random access memory (STT MRAM) device comprising:
a bottom pinned magnetic tunnel junction (MTJ) stack located on a bottom electrode, wherein the bottom pinned MTJ stack comprises:
a tunnel barrier layer located on a magnetic pinned layer; and
a magnetic free layer located on the tunnel barrier layer, wherein the magnetic free layer comprises a heavy metal-containing layer sandwiched between a first magnetic region of the magnetic free layer and a second magnetic region of the magnetic free layer.

15. The STT MRAM device of claim 14, wherein the heavy metal-containing layer is composed of a noble metal, a refractory metal, a rare earth metal or alloys thereof.

16. The STT MRAM device of claim 14, wherein the magnetic free layer has a magnetization that can be changed in orientation relative to a magnetization orientation of the magnetic pinned layer.

17. The STT MRAM device of claim 14, further comprising a MTJ capping layer located on the magnetic free layer, and another heavy metal-containing layer located on the MTJ capping layer.

18. The STT MRAM device of claim 17, wherein the another heavy metal-containing layer located on the MTJ capping layer is composed of a noble metal, a refractory metal, a rare earth metal or alloys thereof.

19. A spin-transfer torque magnetoresistive random access memory (STT MRAM) device comprising:
a bottom pinned magnetic tunnel junction (MTJ) stack located on a bottom electrode, wherein the bottom pinned MTJ stack comprises:
a tunnel barrier layer located on a magnetic pinned layer;
a magnetic free layer located on the tunnel barrier layer;
a MTJ capping layer located on the magnetic free layer; and
a heavy metal-containing layer located on the MTJ capping layer, wherein the heavy metal-containing layer is spaced apart from the magnetic free layer by at least the MTJ capping layer.

20. The STT MRAM device of claim 19, wherein the heavy metal-containing layer is composed of a noble metal, a refractory metal, a rare earth metal or alloys thereof.

* * * * *